(12) United States Patent
Saha et al.

(10) Patent No.: US 7,709,311 B1
(45) Date of Patent: May 4, 2010

(54) JFET DEVICE WITH IMPROVED OFF-STATE LEAKAGE CURRENT AND METHOD OF FABRICATION

(75) Inventors: Samar K. Saha, Milpitas, CA (US); Ashok K. Kapoor, Palo Alto, CA (US)

(73) Assignee: SuVolta, Inc., Los Gatos, CA (US)

( * ) Notice: Subject to any disclaimer, the term of this patent is extended or adjusted under 35 U.S.C. 154(b) by 84 days.

(21) Appl. No.: 12/178,404

(22) Filed: Jul. 23, 2008

Related U.S. Application Data

(62) Division of application No. 11/744,080, filed on May 3, 2007, now Pat. No. 7,525,138.

(51) Int. Cl.
*H01L 21/337* (2006.01)
(52) U.S. Cl. .................. 438/194; 438/186; 257/285; 257/286; 257/E21.4; 257/E21.446
(58) Field of Classification Search ........... 438/186, 438/194; 257/285, 286, E21.4, E21.446
See application file for complete search history.

(56) References Cited

U.S. PATENT DOCUMENTS

| | | | | |
|---|---|---|---|---|
| 5,159,414 A | * | 10/1992 | Izumi et al. | 257/192 |
| 5,376,812 A | * | 12/1994 | Oku | 257/279 |
| 5,472,895 A | | 12/1995 | Park | 437/44 |
| 5,668,397 A | * | 9/1997 | Davis et al. | 257/520 |
| 5,907,168 A | * | 5/1999 | Childs | 257/256 |
| 6,373,102 B1 | * | 4/2002 | Huang | 257/345 |
| 7,176,084 B2 | | 2/2007 | Lee et al. | 438/257 |
| 7,560,755 B2 | * | 7/2009 | Kapoor | 257/256 |
| 2008/0272395 A1 | * | 11/2008 | Banna | 257/190 |
| 2009/0017585 A1 | * | 1/2009 | Kapoor | 438/186 |

FOREIGN PATENT DOCUMENTS

CA    2 590 147 A1    6/2006

OTHER PUBLICATIONS

USPTO; *Notice of Allowance and Fee(s) Due* for U.S. Appl. No. 11/744,080, filed May 3, 2007 in the name of Samar K. Saha; 6 pages, Feb. 10, 2009.
Sung J. Kim, et al.; *Integrated Amplifiers Using Fully Ion-Implanted InP JFET's With High Transconductance*; IEEE Electron Device Letters, vol. 9, No. 6; XP-000005882; 3 pages, Jun. 1988.

(Continued)

*Primary Examiner*—Ngan Ngo
(74) *Attorney, Agent, or Firm*—Baker Botts L.L.P.

(57) ABSTRACT

A junction field effect transistor comprises a semiconductor substrate. A first impurity region of a first conductivity type is formed in the substrate. A second impurity region of the first conductivity type is formed in the substrate and spaced apart from the first impurity region. A channel region of the first conductivity type is formed between the first and second impurity regions. A gate region of a second conductivity type is formed in the substrate between the first and second impurity regions. A gap region is formed in the substrate between the gate region and the first impurity region such that the first impurity region is spaced apart from the gate region.

20 Claims, 3 Drawing Sheets

OTHER PUBLICATIONS

M. Wada, et al.; *12 GHz GaAs J-FET 256/258 Dual-Modulus Prescaler IC*; GaAs IC Symposium; XP-10085925; 4 pages, 1989.
Saha, Samar; *Design Considerations for 25 nm MOSFET Devices*; Pergamon; Solid-State Electronics 45; pp. 1851-1857, Received Feb. 7, 2000, Revised Apr. 27, 2001.
Saha, Samar; *Device Characteristics of Sub-20 nm Silicon Nanotransistors*; SPIE Conf. Proc. on Advanced Microelectronic Manufacturing II; vol. 5042; pp. 172-179, 2003.

*PCT Notification of Transmittal of the International Search Report and the Written Opinion of the International Searching Authority* for International Application No. PCT/US2008/061095; 12 pages, Jul. 21, 2008.
*USPTO; Office Action* for U.S. Appl. No. 11/744,080, filed May 3, 2007 in the name of Samar K. Saha, et al.; 5 pages, Oct. 28, 2008.

* cited by examiner

JFET DEVICE WITH IMPROVED OFF-STATE LEAKAGE CURRENT AND METHOD OF FABRICATION

CROSS-REFERENCE TO RELATED APPLICATION

This application is a divisional of U.S. application Ser. No. 11/744,080 filed May 3, 2007 now U.S. Pat. No. 7,525,138 and entitled "JFET Device With Improved Off-State Leakage Current and Method of Fabrication".

TECHNICAL FIELD OF THE INVENTION

This invention relates in general to semiconductor devices, and more particularly to a junction field effect transistor with improved off-state leakage current.

BACKGROUND OF THE INVENTION

In prior semiconductor devices where highly doped extension regions abut or are in close proximity to a highly doped gate region, a high electric field is created at the gate/extension junctions due to applied drain voltage. This high electric field causes effects, such as band-to-band tunneling between the gate region and the extension regions. Typically, in the OFF-state of a transistor, the gate voltage is "OFF" with the drain at the supply voltage. Therefore, high-field effects like band-to-band tunneling cause leakage currents when the device is in an OFF-state. This increases the OFF-state leakage current, Ioff, of the device. This high leakage current causes higher chip standby current and power dissipation. This makes the device undesirable for particular applications.

SUMMARY OF THE INVENTION

In accordance with the present invention, the disadvantages and problems associated with prior junction field effect transistors have been substantially reduced or eliminated.

In accordance with one embodiment of the present invention, a junction field effect transistor comprises a semiconductor substrate. A first impurity region of a first conductivity type is formed in the substrate. A second impurity region of the first conductivity type is formed in the substrate and spaced apart from the first impurity region. A channel region of the first conductivity type is formed between the first and second impurity regions. A gate region of a second conductivity type is formed in the substrate between the first and second impurity regions. A gap region is formed in the substrate between the gate region and the first impurity region such that the first impurity region is spaced apart from the gate region.

Another embodiment of the present invention is a method for forming a junction field effect transistor. The method comprises forming a drain region of a first conductivity type in a semiconductor substrate, forming a source region of the first conductivity type in the semiconductor substrate, and forming a channel region of the first conductivity type between the drain and source regions. The method continues by forming a gate electrode region of a second conductivity type such that the gate electrode region overlays the semiconductor substrate, and forming a gate region of the second conductivity type in the semiconductor substrate. The method continues by forming a spacer between the gate electrode region and the drain region, the spacer abutting one side of the gate electrode region. The method concludes by forming a link region of the first conductivity type in the semiconductor substrate. The link region abuts the drain region and is spaced apart from the gate region.

The following technical advantages may be achieved by some, none, or all of the embodiments of the present invention.

By spacing apart one or both link regions from the gate region using gap regions, the semiconductor device reduces the effects of a high electric field due to a heavily doped junction and the band-to-band tunneling described above. In addition to reducing the effects of band-to-band tunneling, by spacing apart one or both link regions from the gate region, the effective length of the channel region is increased during an OFF-state of operation for the semiconductor device. These device characteristics consequently reduce the OFF-state leakage current, Ioff, by approximately an order of magnitude over previous devices.

These and other advantages, features, and objects of the present invention will be more readily understood in view of the following detailed description, drawings, and claims.

BRIEF DESCRIPTION OF THE DRAWINGS

For a more complete understanding of the present invention and its advantages, reference is now made to the following descriptions, taken in conjunction with the accompanying drawings, in which.

DETAILED DESCRIPTION OF THE INVENTION

Figure 1:
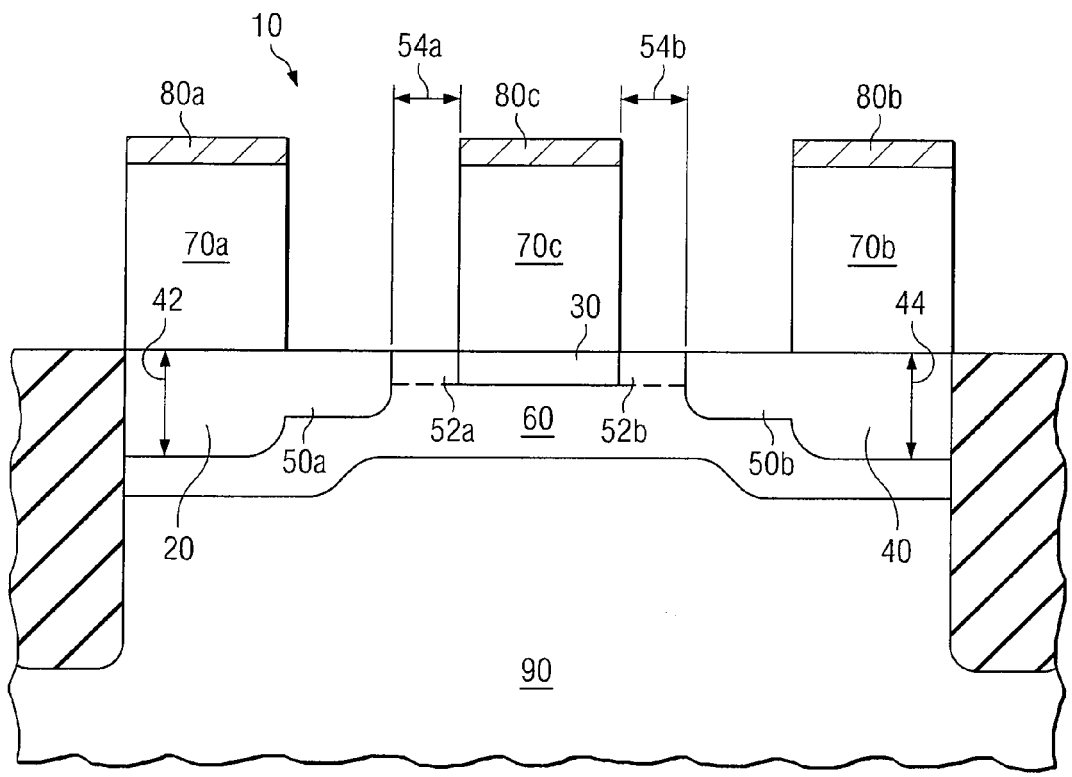
FIG. 1 illustrates a junction field effect transistor according to the present invention.

FIG. 1 illustrates a semiconductor device 10 according to a particular embodiment of the present invention. As shown in FIG. 1, semiconductor device 10 includes a source region 20, a gate region 30, a drain region 40, link regions 50a-b, gap regions 52a-b, channel region 60, polysilicon regions 70a-c, contacts 80a-c, and a substrate 90. These regions are not necessarily drawn to scale. Semiconductor device 10 comprises a junction field effect transistor (JFET). When appropriate voltages are applied to contacts 80 of semiconductor device 10, a current flows through channel region 60 between source region 20 and drain region 40. By providing at least gap region 52b between link region 50b and gate region 30, as described in greater detail below, semiconductor device 10 exhibits enhanced performance characteristics in an OFF-state of operation. In particular, device 10 exhibits a reduced gate leakage current in an OFF-state of operation.

Substrate 90 represents bulk semiconductor material to which dopants can be added to form various conductivity regions (e.g., source region 20, gate region 30, drain region 40, link regions 50a-b, and channel region 60). Substrate 90 may be formed of any suitable semiconductor material, such as materials from Group III and Group V of the periodic table. In particular embodiments, substrate 90 is formed of single-crystal silicon. Substrate 90 may have a particular conductivity type, such as p-type or n-type. In particular embodiments, semiconductor device 10 may represent a portion of a substrate 90 that is shared by a plurality of different semiconductor devices (not illustrated in FIG. 1).

Channel region 60 provides a path to conduct current between source region 20 and drain region 40 through link regions 50a and 50b. Channel region 60 is formed by the addition of a first type of dopant to substrate 90. For example, the first type of dopant may represent particles of n-type doping material such as antimony, arsenic, phosphorous, or any other appropriate n-type dopant. Alternatively, the first type of dopant may represent particles of p-type doping material such as boron, gallium, indium, or any other suitable p-type dopant. Where the channel region 60 is doped with n-type impurities, electrons flow from the source region 20 to the drain region 40 to create a current when an appropriate voltage is applied to device 10. Where channel region 60 is doped with p-type impurities, holes flow from the source region 20 to the drain region 40 to create a current when an appropriate voltage is applied to device 10. The doping concentration for channel region 60 may range from $1\,\text{E}+18\,\text{cm}^{-3}$ to $1\,\text{E}+19\,\text{cm}^{-3}$. Moreover, the doping concentration for channel region 60 may be maintained such that device 10 operates in an enhancement mode, with a current flowing between drain region 40 and source region 20 when a positive voltage differential is applied between source region 20 and gate region 30. In particular, the doping concentration of channel region 60 is lower than source region 20, drain region 40, and link regions 50a and 50b.

Source region 20 and drain region 40 each comprise regions of substrate 90 formed by the addition of the first type of dopant to substrate 90. Thus, for an n-channel device 10, source region 20 and drain region 40 are doped with n-type impurities. For a p-channel device 10, source region 20 and drain region 40 are doped with p-type impurities. In particular embodiments, source region 20 and drain region 40 have a doping concentration at or higher than $1\,\text{E}+19\,\text{cm}^{-3}$.

In particular embodiments, source region 20 and drain region 40 are formed by the diffusion of dopants through corresponding polysilicon regions 70a and 70c, respectively. Consequently, in such embodiments, the boundaries and/or dimensions of source region 20 and drain region 40 may be precisely controlled. As a result, in particular embodiments, the depth of source region 20 (as indicated by arrow 42) is less than one-hundred nanometers (nm), and the depth of drain region 40 (as indicated by arrow 44) is also less than one-hundred nm. In certain embodiments, the depths of source region 20 and/or drain region 40 are between twenty and fifty nm. Because of the reduced size of source region 20 and drain region 40, particular embodiments of semiconductor device 10 may experience less parasitic capacitance during operation, thereby allowing semiconductor device 10 to function with a lower operating voltage.

Gate region 30 is formed by doping substrate 90 with a second type of dopant. As a result, gate region 30 has a second conductivity type. Thus, for an n-channel device 10, gate region 30 is doped with p-type impurities. For a p-channel device 10, gate region 30 is doped with n-type impurities. In particular embodiments, gate region 30 is doped with the second type of dopant to a concentration at or higher than $1\,\text{E}+19\,\text{cm}^{-3}$. As described further below, when a voltage is applied to gate region 30, the applied voltage alters the conductivity of the neighboring channel region 60, thereby facilitating or impeding the flow of current between source region 20 and drain region 40. Although FIG. 1 illustrates an embodiment of semiconductor device 10 that includes only a single gate region 30, alternative embodiments may include multiple gate regions 30. As with regions 20 and 40, gate region 30 may be formed by diffusing dopants from a corresponding polysilicon region 70c.

Link regions 50a and 50b comprise regions of substrate 90 formed by doping substrate 90 with n-type or p-type impurities, as appropriate. In particular embodiments, link regions 50a and 50b are doped using a different technique from that used to dope source region 20 and drain region 40. Because link regions 50a and 50b are of the same conductivity type as source region 20 and drain region 40, however, the boundary between source region 20 and link region 50a and the boundary between drain region 40 and link region 50b may be undetectable once the relevant regions have been formed. For example, in particular embodiments, source region 20 and drain region 40 are formed by diffusing dopants through polysilicon regions 70a and 70b, respectively. Ion implantation or plasma immersion implantation is then used to add dopants to appropriate regions of substrate 90, thereby forming link regions 50a and 50b. Because the doping concentrations for these regions are similar or identical, the boundary between source region 20 and link region 50a and the boundary between drain region 40 and link region 50b are substantially undetectable after semiconductor device 10 has been formed. Thus, each of the combination of drain region 40 and link region 50b, or the combination of source region 20 and link region 50a may be referred to collectively as impurity regions.

In prior semiconductor devices where the highly doped link region 52b abuts or is in close proximity to highly doped gate region 30, band-to-band tunneling effects between gate region 30 and link regions 52a and/or 52b cause leakage currents when device 10 is in an OFF-state. This increases the OFF-state leakage current, Ioff, of device 10. This high leakage current causes higher chip standby current and power dissipation. This makes the device undesirable for use in particular applications. Gap region 52a comprises a region of semiconductor substrate 90 that separates link region 50a from gate region 30. Gap region 52b comprises a region of semiconductor substrate 90 that separates link region 50b from gate region 30. In a particular embodiment, gap regions 52a-b are formed in channel region 60. The doping concentration of gap regions 52a and/or 52b are generally at least an order of magnitude less than the doping concentration of link regions 50a and/or 50b, respectively. Thus, the doping concentration of gap regions 52a-b can range from no doping or very low doping concentrations to up to $10\,\text{E}+18\,\text{cm}^{-3}$.

By spacing apart link region 50a and/or link region 50b from gate region 30 using gap regions 52a and 52b, respectively, device 10 reduces the effects of band-to-band tunneling described above. In addition to reducing the effects of high electric fields, like band-to-band tunneling, by spacing apart link regions 50a and/or 50b from gate region 30, the effective length of channel 60 is increased during an OFF-state of operation for device 10. These device characteristics consequently reduce the magnitude of OFF-state leakage current, Ioff. In particular embodiments, the distance 54a between link region 50a and gate region 30, and the distance 54b between link region 50b and gate region 30 can range from 10 to 50 nanometers. Using these parameters, device 10 exhibits an order of magnitude reduction of Ioff while the ON-state current, Ion, remains substantially the same. Thus, the ratio of Ion to Ioff is increased using gap regions 52a and/or 52b.

Polysilicon regions 70a-c comprise polysilicon structures that provide an ohmic connection between contacts 80a-c and source region 20, drain region 40, and gate region 30, respectively. In particular embodiments, polysilicon regions 70 may connect pins of an integrated circuit package to the various regions of semiconductor device 10. Furthermore, in particular embodiments, source region 20, drain region 40, and gate region 30 are formed by dopants that are diffused through polysilicon regions 70. As a result, in particular embodiments, polysilicon regions 70 may themselves comprise doped material, even after any appropriate diffusion of dopants into the various regions of substrate 90 has occurred.

Additionally, in particular embodiments, polysilicon regions 70 may be coplanar. Moreover, in particular embodiments, contacts 80 may additionally or alternatively be coplanar so that particular surfaces of all contacts 80 have the same height. Coplanar polysilicon regions 70 and/or contacts 80 may simplify the manufacturing and packaging of semiconductor device 10.

In operation, channel region 60 provides a voltage-controlled conductivity path between source region 20 and drain region 40 through link regions 50. More specifically, a voltage differential between gate region 30 and source region 20 (referred to herein as $V_{GS}$) controls channel regions 60 by increasing or decreasing a width of a depletion region formed within channel region 60. The depletion region defines an area within channel region 60 in which the recombination of holes and electrons has depleted semiconductor device 10 of charge carriers. Because the depletion region lacks charge carriers, it will impede the flow of current between source region 20 and drain region 40. Moreover, as the depletion region expands or recedes, the portion of channel regions 60 through which current can flow grows or shrinks, respectively. As a result, the conductivity of channel region 60 increases and decreases as $V_{GS}$ changes, and semiconductor device 10 may operate as a voltage-controlled current regulator.

Furthermore, in particular embodiments, semiconductor device 10 comprises an enhancement mode device. Thus, when $V_{GS} \leqq 0$, the depletion region pinches off channel regions 60 preventing current from flowing between source region 20 and drain region 40. When $V_{GS} > 0$, the depletion region recedes to a point that a current flows between source region 20 and drain region 40 through link regions 50 and channel region 60 when a positive voltage differential is applied between source region 20 and drain region 40 (referred to herein as $V_{DS}$).

Overall, in particular embodiments, the dimensions of channel region 60, gate region 30, source region 20, and/or drain region 40 may reduce the parasitic capacitances created within semiconductor device 10 and may, as a result, allow semiconductor device 10 to operate with reduced drive current. As a result, one or more semiconductors can be combined onto a microchip to form a memory device, processor, or other appropriate electronic device that is capable of functioning with a reduced operational voltage. For example, in particular embodiments of semiconductor device 10, channel region 60 may conduct current between source region 20 and drain region 40 with a $V_{GS}$ of 0.5V or less. Consequently, electronic devices that include semiconductor device 10 may be capable of operating at higher speed and with lower power consumption than conventional semiconductor devices.

Figure 2:
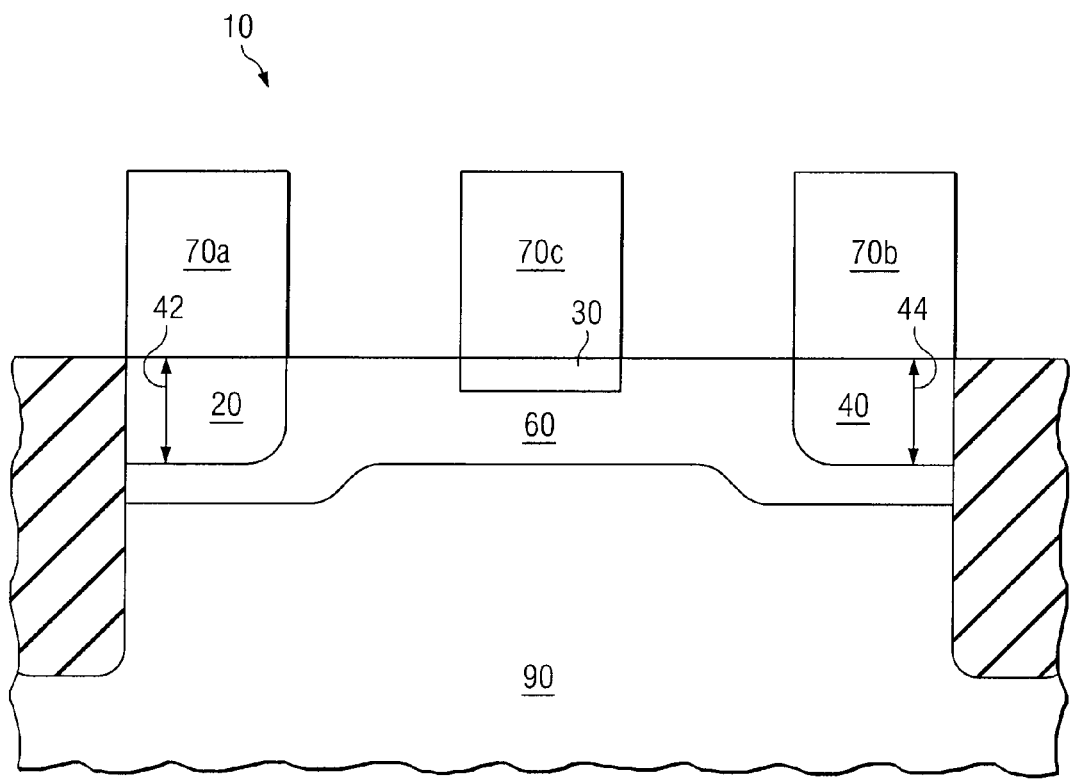
FIGS. 2-6 illustrate one embodiment of a method for fabricating a junction field effect transistor according to the present invention.

FIG. 2 shows a cross sectional view of semiconductor device 10 after particular steps during the fabrication have been completed to form the source region 20, gate region 30, drain region 40, channel region 60, and polysilicon regions 70*a-c*. The various elements of the semiconductor device described in FIGS. 2-6 are not necessarily drawn to scale. In contrast to metal-oxide-semiconductor field-effect transistors (MOSFETs), semiconductor device 10 does not include any oxide layer covering the area in which gate region 30, source region 20, or drain region 40 are to be formed. As a result, in particular embodiments, these regions may be formed by the diffusion of dopants through a corresponding polysilicon region 70. For example, source region 20 may be formed by the diffusion of dopants through polysilicon region 70*a*. Drain region 40 may be formed by the diffusion of dopants through polysilicon region 70*b*. Gate region 30 may be formed by the diffusion of dopants through polysilicon region 70*c*. Consequently, in such embodiments, the boundaries and/or dimensions of region 20, 30, and/or 40 may be precisely controlled.

Figure 3:
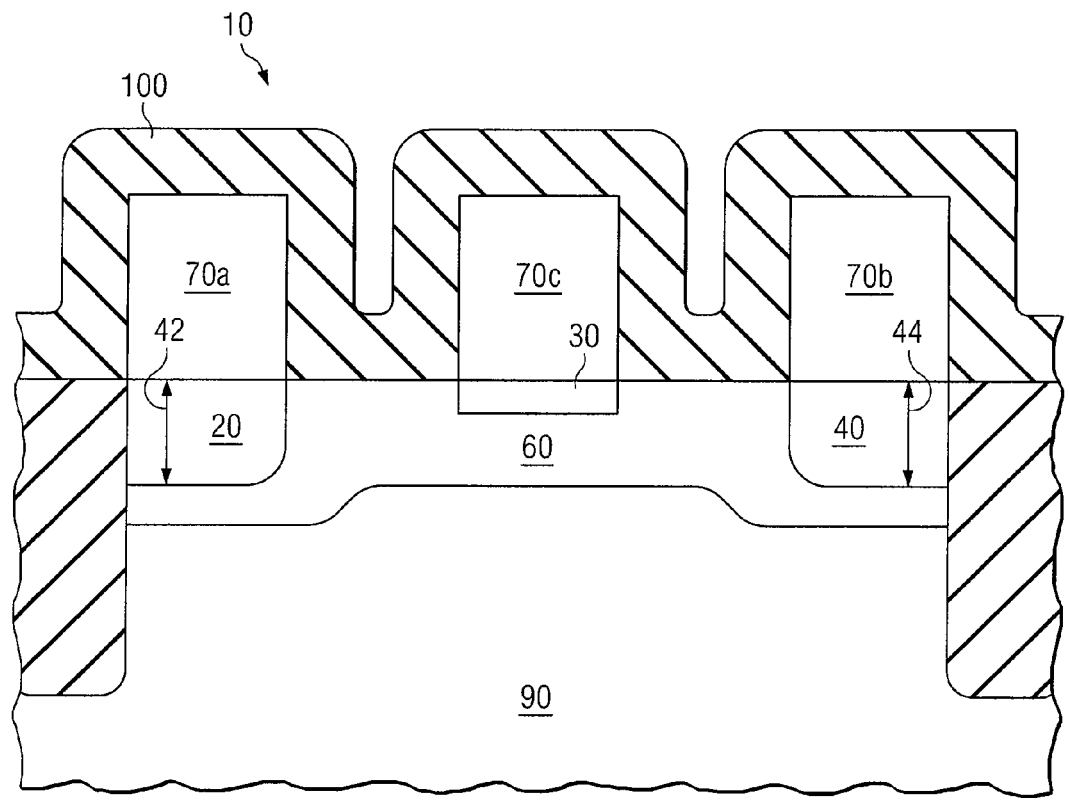

FIG. 3 illustrates the formation of a dielectric layer 100 that is deposited on the top of the entire structure. The dielectric layer 100 comprises any suitable dielectric material such as oxide, nitride, or a combination of the two. The dielectric layer 100 is formed on the polysilicon regions 70 and portions of the substrate 90 through methods including, but not limited to, rapid thermal oxidation (RTO), chemical vapor deposition (CVD), wet oxidation, or other dielectric-growing technologies. Dielectric layer 100 may have a thickness between about 20 to 50 nm.

Figure 4:
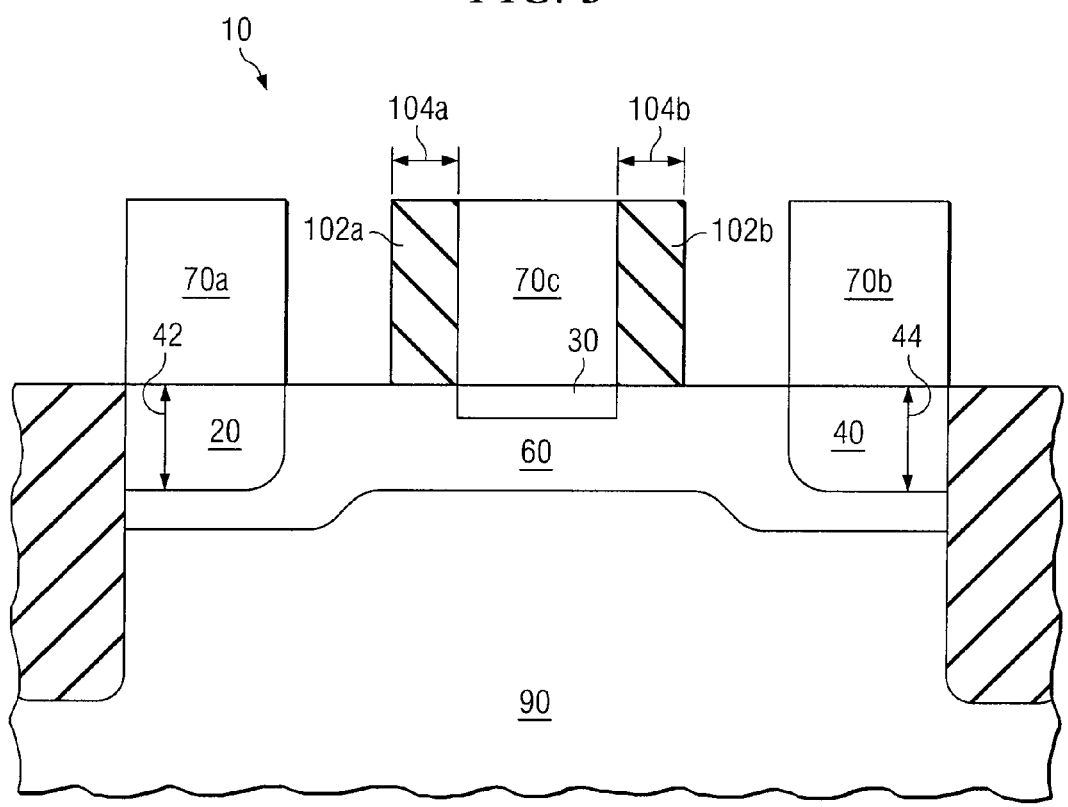

In FIG. 4, the dielectric layer 100 is etched back to expose polysilicon regions 70 and portions of substrate 90, leaving dielectric spacers 102*a-b* only on the sidewalls of polysilicon region 70*c*. Certain portions of the dielectric layer 100 are etched using any suitable etching process, including but not limited to a wet etch, dry etch, anisotropic etch, isotropic etch, RIE (Reactive Ion Etching), or plasma etch. The thickness of spacers 102*a* and 102*b*, illustrated with arrows 104*a* and 104*b*, respectively, is between about 10 to 50 nm.

Figure 5:
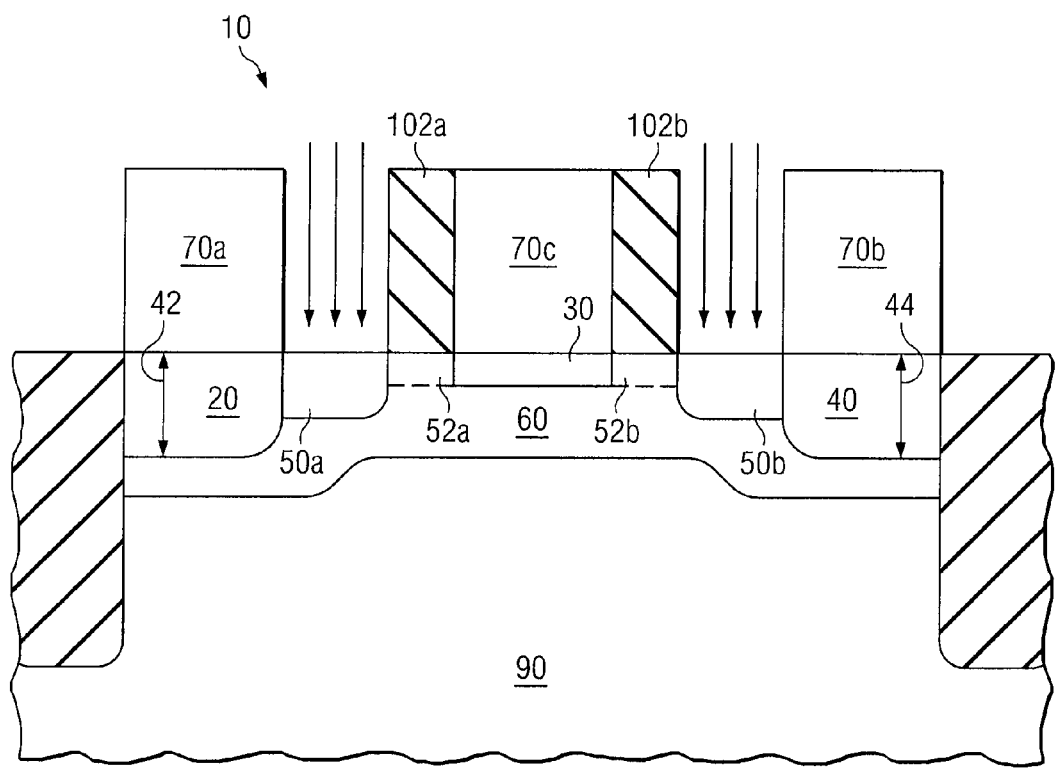

FIG. 5 illustrates the formation of link regions 50*a* and 50*b* by using any suitable doping process, such as but not limited to ion implantation or plasma immersion implantation. For an n-channel device 10, n-type dopants are used to form link regions 50*a* and 50*b* with an implant energy between 0.5 and 100 KeV. For a p-channel device 10, p-type dopants are used to form link regions 50*a* and 50*b* with an implant energy between 0.5 and 100 KeV. By using spacers 102*a* and 102*b*, substrate 90 can be selectively doped to create link regions 50*a-b* that are spaced apart from gate region 30 by gap regions 52*a-b*.

Figure 6:
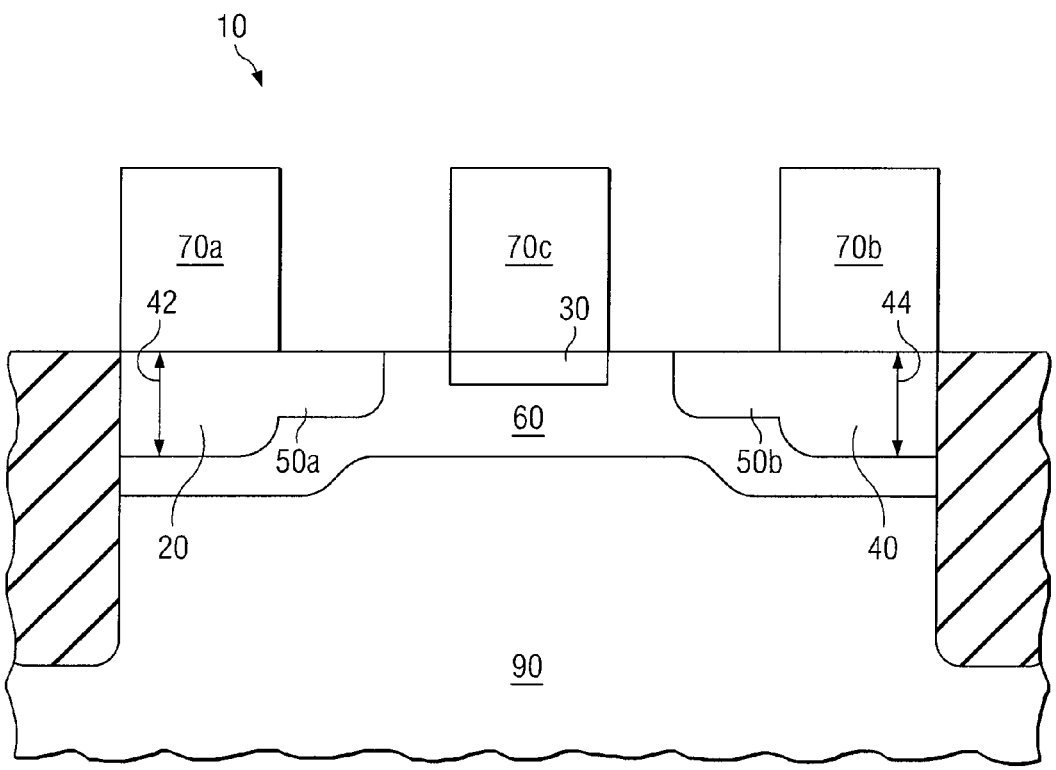

After link regions 50*a-b* are formed in substrate 90 using the techniques described above, spacers 102*a-b* are removed, as illustrated in FIG. 6, using any suitable etching process. This process exposes the sidewalls of polysilicon region 70*c*. From here, the remainder of semiconductor device 10 is formed using suitable fabrication techniques. For example, at least the contact patterning and formation process, and the metal interconnect formation process takes place.

Although FIGS. 2-6 are illustrated and described with reference to forming both of link regions 50*a-b* spaced apart from gate region 30, it should be understood that this process can be adapted to form only one of link regions 50*a* or 50*b* that is spaced apart from gate region 30 and the other link region 50*a* or 50*b* that is not spaced apart from gate region 30. In this regard, after the dielectric layer 100 is formed, as illustrated in FIG. 3, the etching process illustrated in FIG. 4 is modified in order create only one or the other of spacers 102*a* or 102*b*. For example, if only link region 50*b* is to be formed spaced apart from gate region 30, then only spacer 102*b* remains after the etching process of FIG. 4. Similarly, if only link region 50*a* is to be formed spaced apart from gate region 30, then only spacer 102*a* remains after the etching process of FIG. 4.

Although the present invention has been described in detail, it should be understood that various changes, substitutions and alterations can be made hereto without departing from the sphere and scope of the invention as defined by the appended claims.

What is claimed is:

1. A method for fabricating a junction field effect transistor, the method comprising:
   forming a drain region of a first conductivity type in a semiconductor substrate;
   forming a source region of the first conductivity type in the semiconductor substrate;

forming a channel region of the first conductivity type between the drain and source regions;

forming a gate electrode region of a second conductivity type on the semiconductor substrate;

forming a gate region of the second conductivity type in the semiconductor substrate underlying the gate electrode region;

forming a spacer between the gate electrode region and the drain region on the semiconductor substrate, the spacer abutting one side of the gate electrode region;

forming a link region of the first conductivity type in the semiconductor substrate, wherein the link region abuts the drain region and is spaced apart from the gate region due to the spacer.

2. The method of claim 1, wherein:
the first conductivity type comprises n-type; and
the second conductivity type comprises p-type.

3. The method of claim 1, wherein:
the first conductivity type comprises p-type; and
the second conductivity type comprises n-type.

4. The method of claim 1, wherein forming the spacer comprises:
depositing a dielectric layer overlaying at least the gate electrode region; and
etching the dielectric layer to remove portions of the dielectric layer and to leave behind the spacer abutting a sidewall of the gate electrode region.

5. The method of claim 1, further comprising removing the spacer upon formation of the link region.

6. The method of claim 1, wherein forming the link region comprises doping the semiconductor substrate with dopants of the first conductivity type using one of ion implantation or plasma immersion implantation.

7. The method of claim 1, wherein forming the gate region comprises diffusing impurities of the second conductivity type from the gate electrode region into the semiconductor substrate.

8. The method of claim 1, further comprising:
forming a source electrode region of the first conductivity type on the semiconductor substrate;
wherein forming the source region comprises diffusing impurities of the first conductivity type from the source electrode region into the semiconductor substrate.

9. The method of claim 1, further comprising:
forming a drain electrode region of the first conductivity type on the semiconductor substrate;
wherein forming the drain region comprises diffusing impurities of the first conductivity type from the drain electrode region into the semiconductor substrate.

10. The method of claim 1, further comprising forming a gate contact region on the gate electrode region to provide ohmic contact with the gate region.

11. The method of claim 1, wherein the link region is spaced apart from the gate region by a distance of between 10 nm to 50 nm.

12. The method of claim 1, wherein the spacer comprises a first spacer, the link region comprises a first link region, and further comprising:

forming a second spacer between the gate electrode region and the source region on the semiconductor substrate, the spacer abutting another side of the gate electrode region; and forming a second link region of the first conductivity type in the semiconductor substrate, wherein the second link region abuts the source region and is spaced apart from the gate region due to the second spacer.

13. The method of claim 12, further comprising removing the second spacer upon formation of the second link region.

14. The method of claim 12, wherein the second link region is spaced apart from the gate region by a distance of between 10 nm to 50 nm.

15. A method for fabricating a junction field effect transistor, the method comprising:
forming a drain region of a first conductivity type in a semiconductor substrate;
forming a source region of the first conductivity type in the semiconductor substrate;
forming a channel region of the first conductivity type between the drain and source regions;
forming a gate region of the second conductivity type in the channel region;
forming a first gap region between the gate region and the drain region in the semiconductor substrate;
forming a second gap region between the gate region and the source region in the semiconductor substrate;
forming a first link region of the first conductivity type in the semiconductor substrate, wherein the first link region abuts the drain region and is spaced apart from the gate region by the first gap region;
forming a second link region of the first conductivity type in the semiconductor substrate, wherein the second link region abuts the source region and is spaced apart from the gate region by the second gap region.

16. The method of claim 15, wherein the first and second gap regions have a distance of between 10 nm to 50 nm.

17. The method of claim 15, wherein the first and second gap regions have a doping concentration of a magnitude less than the first and second link regions.

18. The method of claim 15, wherein the first and second gap regions have no doping concentration.

19. The method of claim 15, further comprising:
forming a source electrode region and a drain electrode region of the first conductivity type and a gate electrode region of the second conductivity type on the semiconductor substrate;
wherein the source region, the drain region, and the gate region are formed by diffusing impurities of the respective conductivity types through the respective source electrode region, drain electrode region, and gate electrode region into the semiconductor substrate.

20. The method of claim 19, further comprising:
forming a gate contact region on the gate electrode region, a source contact region on the source electrode region, and a drain contact region on the drain electrode region to provide ohmic contact therewith, the gate, source, and drain contact regions being coplanar, the gate, source, and drain electrode regions being coplanar.

* * * * *